United States Patent
Lu et al.

(10) Patent No.: US 11,710,517 B2
(45) Date of Patent: *Jul. 25, 2023

(54) WRITE OPERATION TECHNIQUES FOR MEMORY SYSTEMS

(71) Applicant: Micron Technology, Inc., Boise, ID (US)

(72) Inventors: Zhongyuan Lu, Boise, ID (US); Christina Papagianni, San Jose, CA (US); Hongmei Wang, Boise, ID (US); Robert J. Gleixner, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/569,295

(22) Filed: Jan. 5, 2022

(65) Prior Publication Data

US 2022/0130444 A1 Apr. 28, 2022

Related U.S. Application Data

(63) Continuation of application No. 16/700,948, filed on Dec. 2, 2019, now Pat. No. 11,244,717.

(51) Int. Cl.
*G11C 11/406* (2006.01)
*G11C 11/409* (2006.01)
(Continued)

(52) U.S. Cl.
CPC ............ *G11C 11/409* (2013.01); *G11C 7/222* (2013.01); *G11C 11/4082* (2013.01); *G11C 11/5628* (2013.01)

(58) Field of Classification Search
CPC .................................................. G11C 13/0035
See application file for complete search history.

(56) References Cited

U.S. PATENT DOCUMENTS 9,298,606 B2 3/2016 Ramanujan
11,244,717 B2 * 2/2022 Lu ........................ G11C 16/349
(Continued)

FOREIGN PATENT DOCUMENTS

WO 2018/188085 A1 10/2018

OTHER PUBLICATIONS

ISA/KR, International Search Report and Written Opinion of the International Searching Authority, Int'l Appl. No. PCT/US2020/055344, dated Jan. 26, 2021, Korean Intellectual Property Office, Seo-gu, Daejeon, Republic of Korea, 12pgs.
(Continued)

*Primary Examiner* — Min Huang
(74) *Attorney, Agent, or Firm* — Holland & Hart LLP

(57) ABSTRACT

Methods, systems, and devices for write operation techniques for memory systems are described. In some memory systems, write operations performed on target memory cells of the memory device may disturb logic states stored by one or more adjacent memory cells. Such disturbances may cause reductions in read margins when accessing one or more memory cells, or may cause a loss of data in one or more memory cells. The described techniques may reduce aspects of logic state degradation by supporting operational modes where a host device, a memory device, or both, refrains from writing information to a region of a memory array, or inhibits write commands associated with write operations on a region of a memory array.

20 Claims, 8 Drawing Sheets

(51) Int. Cl.
*G11C 7/22* (2006.01)
*G11C 11/56* (2006.01)
*G11C 11/408* (2006.01)

(56) References Cited

U.S. PATENT DOCUMENTS

| | | |
|---|---|---|
| 2008/0276040 A1 | 11/2008 | Moritoki |
| 2009/0016137 A1 | 1/2009 | Hur et al. |
| 2010/0250874 A1 | 9/2010 | Farrell et al. |
| 2012/0239858 A1 | 9/2012 | Melik-martirosian |
| 2015/0347029 A1 | 12/2015 | Kotte et al. |
| 2015/0363105 A1 | 12/2015 | Nakao et al. |
| 2016/0313944 A1 | 10/2016 | Hodgdon et al. |
| 2017/0316826 A1 | 11/2017 | Nakanishi |
| 2018/0143771 A1 | 5/2018 | Sudan et al. |
| 2019/0065075 A1 | 2/2019 | Nagarajan et al. |
| 2019/0095348 A1 | 3/2019 | Peng et al. |
| 2019/0214087 A1 | 7/2019 | Weinberg et al. |
| 2019/0286367 A1 | 9/2019 | Shirota et al. |
| 2020/0027499 A1 | 1/2020 | Balakrishnan |
| 2020/0066330 A1 | 2/2020 | Hu et al. |

OTHER PUBLICATIONS

Taiwan Intellectual Property Office, "Office Action," issued in connection with ROC (Taiwan) Patent Application No. 109136252, dated Oct. 12, 2021 (10 pages).

International Search Report and Written Opinion received for PCT Patent Application No. PCT/US20/55344, dated Jan. 26, 2021, 10 pages.

European Patent Office, "Extended European search report," issued in connection with European Patent Application No. 20895927 dated Jan. 10, 2023 (7 pages).

Taiwanese Patent Office, "Office Action," issued in connection with Taiwanese Patent Application No. 109136252 dated Mar. 22, 2023 (27 pages).

* cited by examiner

WRITE OPERATION TECHNIQUES FOR MEMORY SYSTEMS

CROSS REFERENCE

The present Application for Patent is a continuation of U.S. patent application Ser. No. 16/700,948 by Lu et al., entitled "WRITE OPERATION TECHNIQUES FOR MEMORY SYSTEMS," filed Dec. 2, 2019, which assigned to the assignee hereof and is expressly incorporated by reference in its entirety herein.

BACKGROUND

The following relates generally to one or more memory systems and more specifically to write operation techniques for memory systems.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

A memory system in accordance with examples disclosed herein may include a memory device and a host device coupled with the memory device. In some memory systems, write operations performed on target memory cells of the memory device may disturb logic states stored by one or more adjacent memory cells. For example, if a quantity of write operations performed on a region of a memory array satisfies (e.g., exceeds) a threshold, or if a rate of write operations (e.g., a quantity of write operations within a duration) performed on a region of a memory array satisfies a threshold, memory cells that are not targeted for write operations may become susceptible to having their stored logic states degraded. Such degradation may cause reductions in read margins when accessing one or more memory cells, or may cause a loss of data in one or more memory cells. Although logic states may be periodically refreshed to overcome some degradation, refresh operations may be associated with undesirable power consumption, adverse memory cell stress or endurance loss, or other drawbacks.

The techniques described herein may reduce aspects of logic state degradation by supporting operational modes where a host device, a memory device, or both, refrains from writing information to a region of a memory array for a duration of time, or inhibits write commands associated with write operations on a region of a memory array for a duration of time. In some examples, such refraining or inhibiting for a duration may support a region of a memory array returning to a nominal state or condition where memory cells are less susceptible to having their logic states degraded by write operations on neighboring memory cells. Identifying such conditions may be performed by one or both of the memory device or the host device, and, in some examples, such refraining or inhibiting may be accompanied by storing write commands in a buffer, determining to access a different region of a memory array, or determining to access a different memory array or memory device altogether. Upon or after a duration of such refraining, write operations on the region of the memory array may resume, or the region of the memory array may be otherwise made available for write operations.

Features of the disclosure are initially described in the context of memory systems, dies, and arrays as described with reference to FIGS. 1-3. Features of the disclosure are further described in the context of corresponding distributions of logic state characteristics, as described with reference to FIG. 4. These and other features of the disclosure are further illustrated by and described with reference to apparatus diagrams and flowcharts that relate to write operation techniques for memory systems as described with references to FIGS. 5-8.

Figure 1:
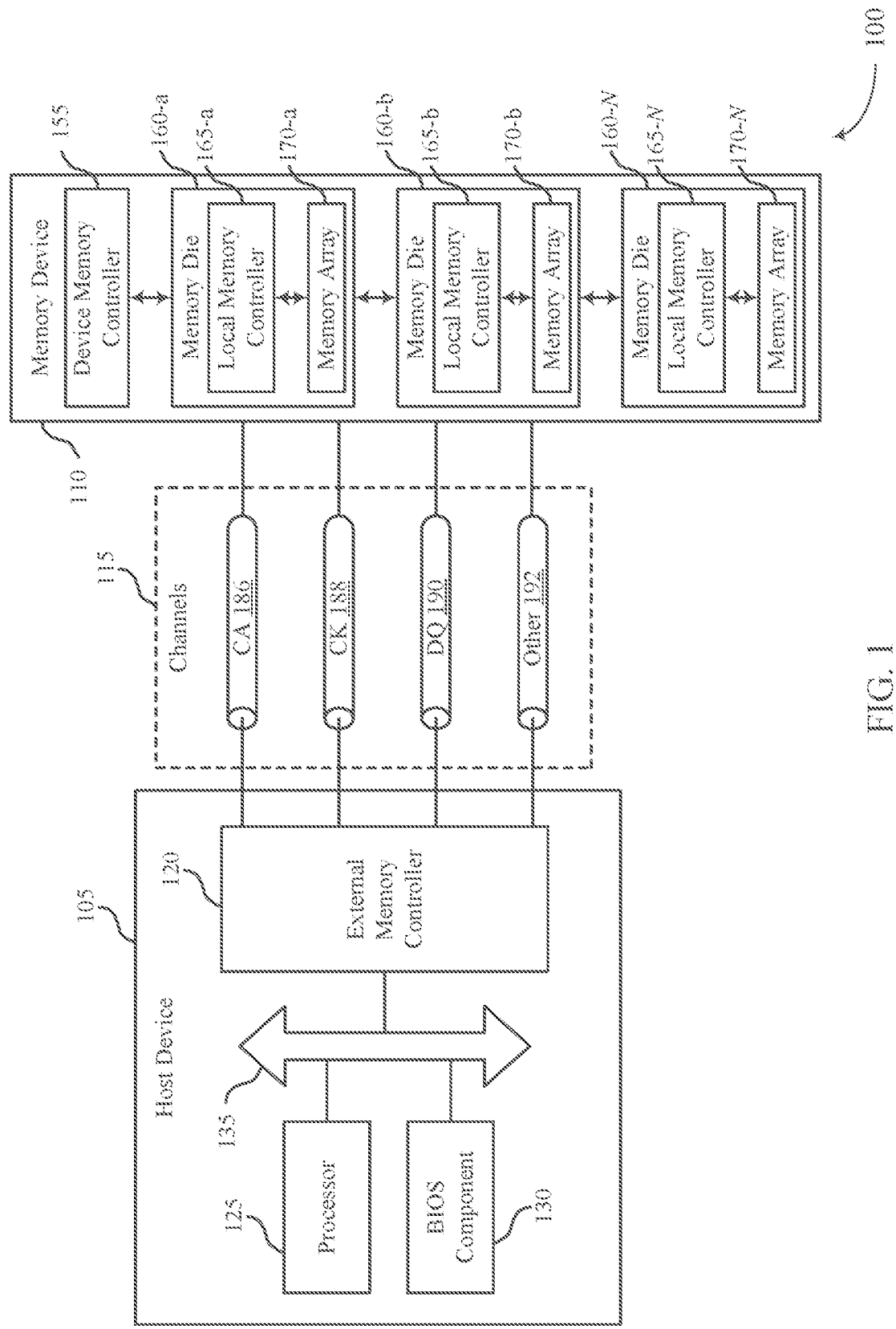
FIG. 1 illustrates an example of a system that supports write operation techniques for memory systems in accordance with examples as disclosed herein.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a row line or column line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, write operations performed on a region of a memory array 170 may disturb logic states stored by one or more neighboring memory cells of the memory array. For example, if a quantity of write operations performed on a region of a memory array 170 satisfies a threshold, or if a rate of write operations (e.g., a quantity of write operations within a duration) performed on a region of a memory array 170 satisfies a threshold, memory cells that are not targeted for write operations may become susceptible to having their stored logic states degraded (e.g., by the write operations). Such degradation may cause reductions in read margins when accessing memory cells of the memory array 170, or may cause a loss of data in one or more memory cells of the memory array 170. Although logic states stored in a memory array 170 may be periodically refreshed to overcome some degradation, refresh operations may be associated with undesirable power consumption, adverse memory cell stress or endurance loss, or other drawbacks.

Logic state degradation may be reduced by supporting operational modes where the host device 105, the memory device 110, or both, may refrain from writing information to a region of a memory array 170 for a duration, or may inhibit write commands associated with write operations on a region of a memory array 170 for a duration. In some examples, such refraining or inhibiting may support a region of a memory array 170 returning to a nominal state or condition where memory cells are less susceptible to having their logic states degraded by write operations on neighboring memory cells. Identifying such conditions may be performed by one or both of the memory device 110 or the host device 105, and, in some examples, such refraining or inhibiting may be accompanied by storing write commands in a buffer (e.g., at the memory device 110, at the host device 105), determining to access a different region of a memory array 170, or determining to access a different memory array 170 or memory device 110. Moreover, in various examples, such refraining or inhibiting may be supported or otherwise enhanced by signaling between the host device 105 and the memory device 110.

Figure 2:
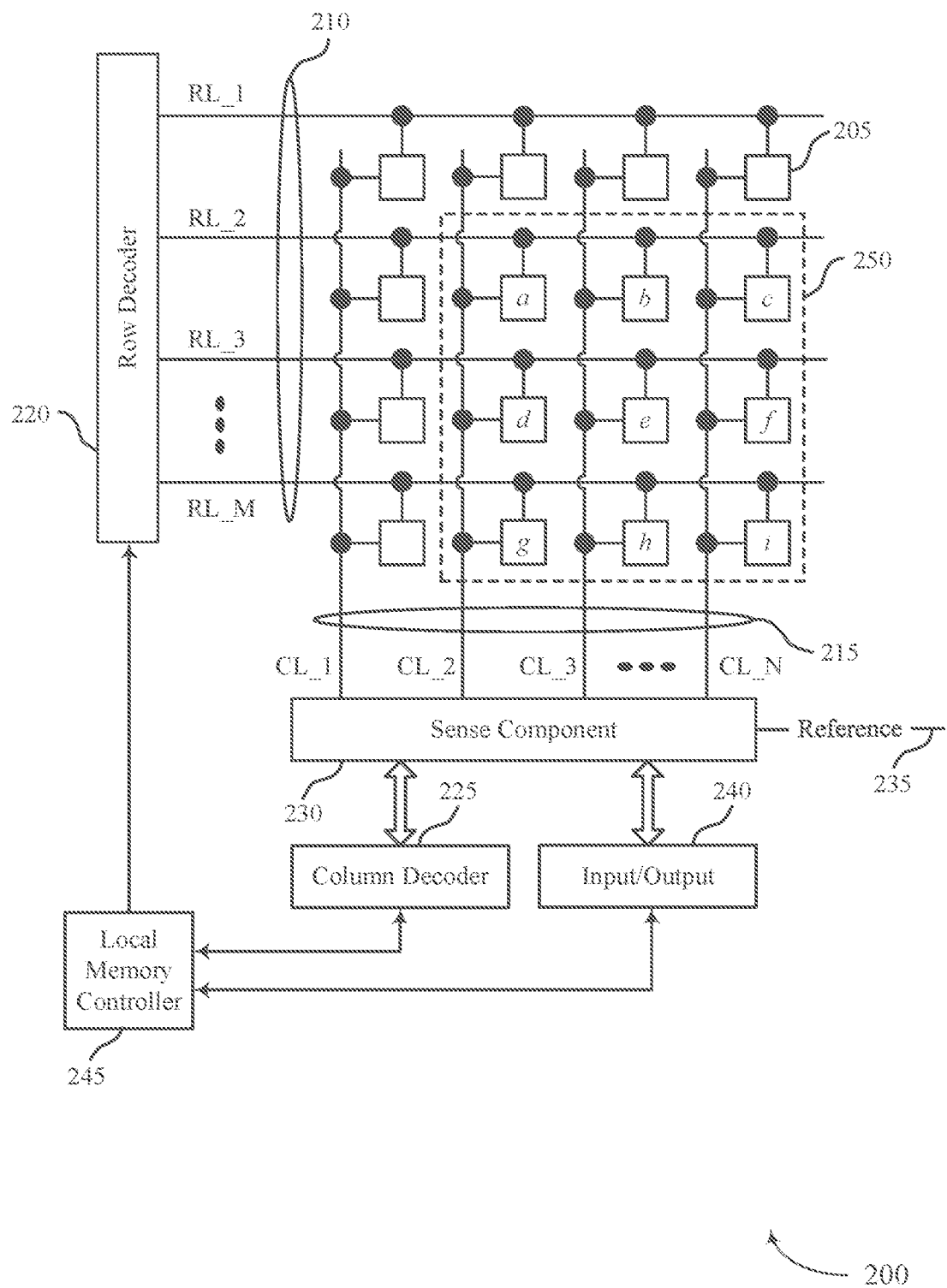
FIG. 2 illustrates an example of a memory die that supports write operation techniques for memory systems in accordance with examples as disclosed herein.

FIG. 2 illustrates an example of a memory die 200 in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include the access lines (e.g., row lines 210, column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a voltage to the row line 210 or the column line 215), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 260 and activate a row line 210 based on the received row address. A column decoder 225 may receive a column address from the local memory controller 260 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 260 may control the accessing of memory cells 205 through the various components (e.g., row decoder 220, column decoder 225, sense component 230). The local memory controller 260 may be an example of the local memory controller 165 described with reference to FIG. 1. In some examples, one or more of the row decoder 220, column decoder 225, and sense component 230 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target row line 210 and the target column line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The local memory controller 260 may apply a specific signal (e.g., write pulse) to the column line 215 during the write operation to store a specific state in the storage element of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target row line 210 and a target column line 215 coupled with the target memory cell 205 (e.g., the address of the target memory cell 205). The local memory controller 260 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 260 may activate the sense component 230 (e.g., latch the sense component) and thereby compare the signal received from the memory cell 205 to the reference 235. Based on that comparison, the sense component 230 may determine a logic state that is stored on the memory cell 205. The pulse used as part of the read operation may include one or more voltage levels over a duration.

In some examples, write operations performed on target memory cells 205 may disturb logic states stored by one or more neighboring memory cells 205. For example, for illustrative purposes, the memory cells 205 may be arranged in, or otherwise grouped in a region 250, where the region 250 includes memory cells a through i. When a write operation is performed on a memory cell 205 in the region 250, a disturbance may be imposed on one or more other memory cells 205 in the region 250. For example, when a write operation is performed on memory cell a, the write operation may impose a disturbance on one or more of memory cells b through i. Likewise, when a write operation is performed on memory cell b, the write operation may impose a disturbance on one or more of memory cells a and c through i, and so on. In some examples, the imposed disturbance may be stronger for relatively nearer cells, such that a write operation performed on memory cell a may impose a disturbance on memory cell e that is stronger than a disturbance imposed on memory cell i. Although the memory die 200 is illustrated with a single region 250, memory cells 205 of the memory die 200 may be arranged in any quantity of regions 250, and a memory cell 205 may be a member of one or more of the regions 250.

In some cases, disturbances in the region 250 may not be strong enough to cause a degradation of logic states stored by the memory cells 205 in the region. However, if a quantity of write operations performed on a set of memory cells 205 satisfies a threshold, or if a rate of write operations (e.g., a quantity of write operations within a window of time) performed on a set of memory cells 205 satisfies a threshold, memory cells 205 that are not targeted for write operations may become susceptible to having their stored logic states degraded. In other words, in some examples, degradation of logic states stored by the memory cells 205 may be stronger when a quantity of write operations within a window of time is relatively high. Such degradation may cause reductions in read margins when accessing the memory cells 205, or may cause a loss of data in the memory cells 205.

In one example, target memory cells 205 may be written at least in part by a thermal cycle or profile applied to a material element of the respective memory cells 205. For example, a memory cell 205 may be written by heating the corresponding material element to reach an unstable amorphous atomic arrangement (e.g., to melt the material element, to cause the material element to transition to a relatively amorphous phase), followed by a relatively fast cooling (e.g., to cause the material to reach a stable, relatively amorphous phase) or a relatively slow cooling (e.g., to cause the material to reach a stable, relatively crystalline phase). In some examples, such a heating and cooling may be supported by applying one or more current pulses via the corresponding row line 210 and column line 215.

In some examples, the heating and cooling associated with writing a target memory cell 205 in the region 250 may result in inadvertent or undesirable heating of neighboring (e.g., non-target) memory cells 205 of the region 250. For example, heating associated with a quantity or rate of write operations on a set of memory cells 205 may exceed a threshold rate of heat dissipation, which may cause a temperature (e.g., a bulk temperature of the region 250, an average temperature of the region 250, a regional temperature) of a set of the memory cells 205 to rise. Such heating of neighboring memory cells 205 may, for example, cause a transition in a material state or characteristic of the neighboring memory cells 205.

In one example, a neighboring memory cell 205 of the region 250 may have a material element that was written with a relatively amorphous material state, and heating associated with a write operation on a neighboring memory cell 205 of the region 250 may mobilize atoms of the material element to transition towards a more-crystalline arrangement. In other words, heating of a material memory element that was written with a relatively amorphous atomic arrangement may cause an inadvertent transition towards a more-crystalline atomic arrangement. A transition towards a more-crystalline atomic arrangement, or away from a more-amorphous atomic arrangement, may reduce an ability to distinguish the memory cell 205 as being originally written with a more-amorphous atomic arrangement. Thus, according to this and other examples, the adverse heating of neighboring memory cells 205 during a write operation may reduce an ability to properly read a logic state originally written to a memory cell 205.

Although described in the context of inadvertent or degrading transitions in atomic arrangement resulting from write operations on neighboring memory cells 205, degradation of stored states in the memory cells 205 may result from other phenomena. For example, for memory cells 205 that distinguish logic states based on material memory elements storing different threshold characteristics, stored logic states may be degraded when heating from write operations on neighboring memory cells 205 causes threshold characteristics to change (e.g., causing a threshold voltage of a memory cell 205 to rise or fall, as compared with an originally-written threshold voltage). In another example, for memory cells 205 that distinguish logic states based on a maintained charge or polarization, stored logic states may be degraded when heating from write operations on neighboring memory cells 205 change a capacity for storing a charge or polarization (e.g., due to temperature-dependent charge capacity, due to temperature-dependent saturation polarization, due to temperature-dependent dielectric characteristics). Moreover, although described in the context of inadvertent or undesirable heating from write operations, such heating may be caused by other access operations, such as read operations or refresh operations, that may cause thermal degradation of logic states stored in a region 250 of a memory array.

In some examples, to accommodate proper read operations in the presence of such degradation, the memory die 200 may be configured to perform periodic refresh operations to mitigate, reduce, or eliminate the effect of such degradation (e.g., to restore an as-written state). However, such refresh operations may be associated with undesirable power consumption, adverse memory cell stress or endurance loss, or other drawbacks. Additionally or alternatively, the memory die 200 may be configured with relatively broad guard bands between the characteristics of different logic states, but such a configuration may be associated with relatively narrow read window budget, relatively high power consumption, relatively low array density, or other undesirable characteristics.

In accordance with examples as disclosed herein, logic state degradation may be reduced by supporting operational modes where the memory die 200 refrains from, or is inhibited from, writing information to a set of the memory cells 205 (e.g., a region 250 of a memory array). In some examples, refraining from performing write operations or inhibiting write operations may support a set of memory cells 205 returning to a nominal state or condition where memory cells 205 are less susceptible to having their logic states degraded by write operations on neighboring memory cells 205. For example, such refraining or inhibiting for some time period may allow a bulk or regional temperature of the set of memory cells 205 to fall (e.g., through heat dissipation from the region of the memory array), which may include a temperature being reduced to a normal, nominal, or otherwise preferable operating condition for the set of memory cells 205. Upon or after a duration of such refraining or inhibiting, write operations on the region of the memory array may resume, or the region of the memory array may be otherwise made available for write operations (e.g., because a reduction or stabilization of temperature of the set of memory cells 205 may reduce a susceptibility of the set of memory cells 205 to logic state degradation).

Figure 3:
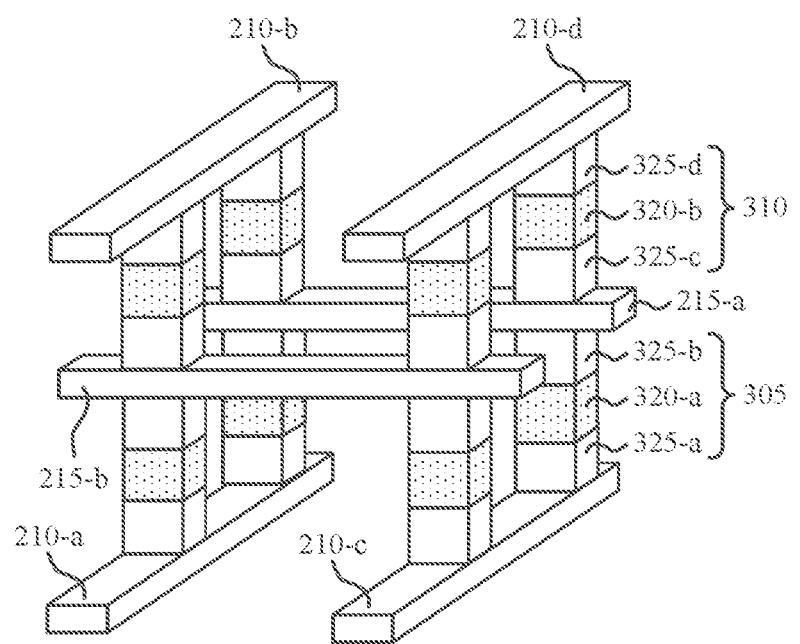
FIG. 3 illustrates an example of a memory array that supports write operation techniques for memory systems in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate and second deck 310 of memory cells on top of the first array or deck 305. Though the example of memory array 300 includes two decks 305, 310, the memory array 300 may include any quantity of decks (e.g., one, two, three, four, five, six, seven, eight).

Memory array 300 may also include a row line 210-*a*, a row line 210-*b*, a row line 210-*c*, a row line 210-*d*, a column line 215-*a*, and a column line 215-*b*, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-*a*, a storage element 320-*a*, or an electrode 325-*b*. One or more memory cells of the second deck 310 may include an electrode 325-*c*, a storage element 320-*b*, and an electrode 325-*d*. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-*c* of the second deck 310 and the second electrode 325-*b* of the first deck 305 may be coupled with column line 215-*a* such that the column line 215-*a* may be shared by vertically adjacent memory cells.

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), sulfur (S), gallium (Ga), tin (Sn), or lead (Pb), or various combinations thereof. In some examples, the chalcogenide may include additional elements such as hydrogen (H), oxygen (O), nitrogen (N), chlorine (Cl), or fluorine (F), each in atomic or molecular forms.

In some examples, a storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline, and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-*a*, storage element 320-*a*, electrode 325-*b*), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state. To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be an alloy (such as the alloys listed above) and may be operated so as to not undergo a phase change (e.g., may not undergo a change between a relatively crystalline state and a relatively amorphous state) during normal operation of the memory cell. For example, the material of the storage element 320 may include a chemical element, such as arsenic, that inhibits the chalcogenide material from changing states and thus may remain in a single state (e.g., an amorphous state or a crystalline state). In some examples, such as for self-selecting memory cells, some or all of the set of logic states supported by the memory cells may be associated with an amorphous state of the chalcogenide material (e.g., the material in a single state may be operable to store different logic states). For example, a logic state '0' and a logic state '1' may both be associated with an amorphous state of the chalcogenide material.

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In some examples, write operations performed on a region of the memory array 300 may disturb logic states stored by one or more neighboring memory cells of the memory array 300. For example, if a quantity of write operations performed on a region of the memory array 300 satisfies a threshold, or if a rate of write operations performed on a region of a memory array 300 satisfies a threshold, memory cells that are not targeted for write operations may become susceptible to having their stored logic states degraded. Such degradation may cause reductions in read margins when accessing memory cells of the memory array 300, or may cause a loss of data in one or more memory cells of the memory array 300.

In one example, heat transfer from write operations performed on one memory cell of the memory array 300 may cause inadvertent or undesirable heating of neighboring (e.g., non-target) memory cells of the memory array 300. For example, heating associated with a quantity or rate of write operations on a region of the memory array 300 may exceed a threshold rate of heat dissipation, which may cause a temperature (e.g., a bulk temperature, a regional temperature) of a set of the memory cells of the memory array 300 to rise. Such heating of neighboring memory cells 205 may, for example, cause a transition in a material state or other physical characteristic of the neighboring memory cells 205.

In some cases, heat may be transferred along one or both of row lines 210 or column lines 215, which may cause localized heating of non-target memory cells of the memory array 300. For example, heat may be transferred to storage elements 320 via electrodes 325, which may result in local mobilization of atoms of a storage element 320 near electrodes 325. In some cases, such a mobilization of atoms may cause localized nucleation of crystalline regions of a storage element 320 near the electrodes 325. Thus, one or more regions of a storage element 320 near electrodes 325 may become partially crystallized by write disturbances caused by write operations on neighboring memory cells. In some examples, heat transfer or bulk heating may be different between a first deck 305 and a second deck 310, or for other arrangements of decks that may have a thermal asymmetry (e.g., an asymmetry with respect to heat transfer paths or thermal conductivity, an asymmetry with respect to thermal capacity), such that storage elements 320 of one deck are more or less susceptible to such crystallization from thermal disturbances. A transition towards a more-crystalline atomic arrangement of a storage element 320, or away from a more-amorphous atomic arrangement of a storage element 320, may reduce an ability to distinguish the corresponding memory cell as being originally written with a more-amorphous atomic arrangement.

Thus, according to this and other examples, adverse heating of memory cells due to write operations of neighboring memory cells of the memory array 300 may reduce an ability to properly read a logic state originally written to a memory cell of the memory array. In accordance with examples as disclosed herein, such logic state degradation may be reduced by supporting operational modes where the host device 105, the memory device 110, or both, may refrain from writing information to a region of the memory array 300 for a duration, or may inhibit write commands associated with write operations on a region of a memory array 300 for a duration. In some examples, such a refrain or inhibition for a period of time may support a relative reduction or stabilization of a bulk or regional temperature of the set of memory cells 205 (e.g., through heat dissipation from the region of the memory array), which may include a temperature being reduced (e.g., over the duration of refraining or inhibiting) to a normal, nominal, or otherwise preferable operating condition for the set of memory cells.

As used herein, a "region" of a memory array may refer to various divisions or organizations of memory cells, and a memory array may include any quantity of one or more regions in the context of the described techniques. For example, a first deck 305 may be referred to as a first region, and a second deck 310 may be referred to as a second region. Thus, when a quantity or rate of write operations on a first deck 305 satisfies a threshold, write operations may be paused or inhibited on the first deck 305. In other examples, a region may span more than one deck, a deck may include multiple regions, or combinations thereof. In some examples, write operations may continue on the second deck 310 while write operations are paused or inhibited on the first deck 305. In some examples, read operations may continue on the first deck 305 while write operations are paused or inhibited on the first deck 305.

In another example, a region of a memory array may refer to a set of memory cells that share a row line 210 or share a set of row lines 210. Additionally or alternatively, a region of a memory array may refer to a set of memory cells that share a column line 215 or share a set of column lines 215. In another example, one region of a memory array may refer to a first independently-addressable section of a memory array associated with a first set of row lines 210 and a first set of column lines 215, and another region of the memory array may refer to a second independently-addressable section of a memory array associated with a second set of row lines 210 and a second set of column lines 215. In another example, a region of a memory array may refer to all of the memory cells associated with a memory array (e.g., for a memory array having a single region). These examples for defining a region of a memory array are for illustrative purposes only, and the described techniques for pausing or inhibiting write operations may be applied to other definitions of a region of a memory array.

In some examples, refraining from performing write operations or inhibiting write operations for a time period may support a region of a memory array 300 returning to a nominal state or condition where memory cells are less susceptible to having their logic states degraded by write operations on neighboring memory cells. For example, such refraining or inhibiting may allow a bulk or regional temperature of the region of the memory array 300 to fall (e.g., through heat dissipation from the region of the memory array), which may include a temperature being reduced (e.g., over the duration of inhibiting or refraining) to a normal, nominal, or otherwise preferable operating condition for the region of the memory array. In such an operating condition, or as a result of such an operating condition, the memory cells may become less susceptible to logic state degradation, such as becoming less susceptible to forming or nucleating crystalline or partially crystalline regions (e.g., in a memory cell written with an amorphous or relatively amorphous atomic arrangement).

Figure 4:
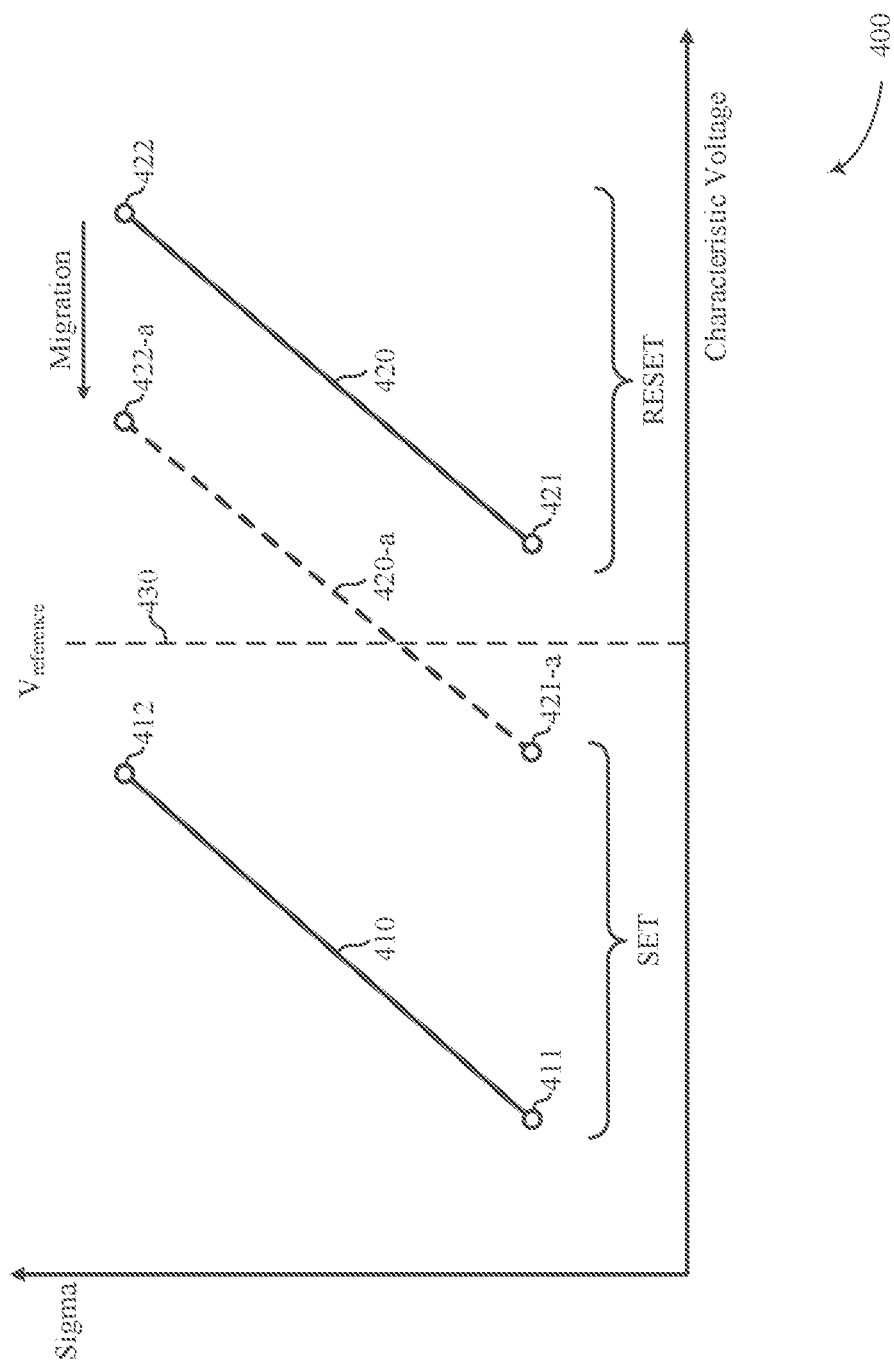
FIG. 4 illustrates an example of a plot of characteristic voltage distributions in a memory device that supports write operation techniques for memory systems in accordance with examples as disclosed herein.

FIG. 4 illustrates a plot 400 of characteristic voltage distributions in a memory device 110 that supports write operation techniques for memory systems in accordance with examples as disclosed herein. The plot 400 may illustrate characteristic voltage distributions of a representative population of memory cells 205 (e.g., a representative population of configurable material memory elements, a representative population of storage elements 320, a population of memory cells 205 of a region 250) of a memory array with respect to a standard deviation, sigma, or some other probabilistic measure. For illustration purposes, the sigma axis may be a nonlinear axis so that a normal distribution of characteristic voltages may be illustrated as linear distributions in the plot 400. In some examples, the distributions of the plot 400 may be referred to as Gaussian distributions.

The characteristic voltages depicted in the plot 400 may be illustrative of various voltages that may be relevant to logic states stored by the represented memory cells. In a first example, the characteristic voltages depicted in the plot 400 may refer to a voltage across a memory cell 205 when applying a read pulse or read signal with a configured current amplitude. Such an interpretation may be representative of PCM memory cells, where different logic states may be associated with different resistance levels of storage elements 320. In other words, memory cells 205 having relatively low characteristic resistances (e.g., memory cells having storage elements 320 with more-crystalline atomic arrangements) may be associated with a relatively low characteristic voltages (e.g., read voltages) in the plot 400, and memory cells 205 having relatively high characteristic resistances (e.g., memory cells 205 having storage elements 320 with more-amorphous atomic arrangements) may be associated with relatively high characteristics voltages in the plot 400.

In a second example, the characteristic voltages depicted in the plot 400 may refer to threshold voltages of the represented memory cells 205, such as a voltage boundary, above which a memory cell 205 will permit current flow, and below which a memory cell 205 will not permit current flow. Such an interpretation may be representative of thresholding memory cells, where different logic states may be associated with different threshold voltage levels of storage elements 320. In other words, memory cells 205 having relatively low threshold voltages may be associated with a relatively low characteristic voltages in the plot 400, and memory cells 205 having relatively high threshold voltages may be associated with relatively high characteristics voltages in the plot 400.

The distribution 410 may illustrate a nominal distribution of characteristic voltages for the representative population of memory cells 205 when storing a first logic state or material state (e.g., a "SET" state). The distribution 410 may be associated with a lower boundary or edge (e.g., edge 411), which may be referred to as "E1," and an upper boundary or edge (e.g., edge 412), which may be referred to as "E2." The distribution 410 may illustrate various interpretations of a statistical distribution, such as a span of six standard deviations (e.g., six sigma), a span of twelve standard deviations (e.g., twelve sigma), or a span between a minimum and maximum characteristic voltage of the representative population of memory cells 205 when storing the SET state.

The distribution 420 may illustrate a nominal distribution of characteristic voltages for the representative population of memory cells 205 when storing a second logic state or material state (e.g., a "RESET" state). The distribution 420 may be associated with a lower boundary or edge (e.g., edge 421), which may be referred to as "E3," and an upper boundary or edge (e.g., edge 422), which may be referred to as "E4." The distribution 420 may illustrate various interpretations of a statistical distribution, such as a span of six standard deviations (e.g., six sigma), a span of twelve standard deviations (e.g., twelve sigma), or a span between a minimum and maximum characteristic voltage of the representative population of memory cells 205 when storing the RESET state.

The plot 400 also illustrates a reference voltage 430 (e.g., a read voltage, a boundary voltage, a demarcation voltage) that may be used for detecting or distinguishing respective logic states stored by the representative population of memory cells 205. In some examples, the reference voltage 430 may be referred to as, or otherwise be associated with a voltage demarcation (VDM), which may refer to a demarcation or other reference voltage or bias configured to be between the SET and RESET state for the representative population of memory cells 205, which may be fixed or variable in a memory device 110.

Referring to the example where the characteristic voltage is associated with a voltage (e.g., a read voltage) across a memory cell 205 when applying a read pulse with a configured current amplitude, or a voltage used to drive the configured read pulse, a logic state of a memory cell 205 may be evaluated based on whether the voltage is above or below the reference voltage 430. Referring to the distributions 410 and 420, memory cells 205 of the representative population that store the SET state may have a read voltage associated with the read pulse that is below the reference voltage 430, and memory cells 205 of the representative population that store the RESET state may have a read voltage associated with the read pulse that is above the reference voltage 430.

Referring to the example where the characteristic voltage is associated with a threshold voltage of a memory cell 205 (e.g., a voltage used to drive a current through the memory cell 205, a voltage used to break down a resistance of the memory cell 205), a logic state of a memory cell 205 may be evaluated based on whether the voltage across the memory cell 205 to cause a threshold event is above or below the reference voltage 430. For example, referring to the distributions 410 and 420, memory cells 205 of the representative population that store the SET state may permit a flow of current (e.g., a flow of current above a threshold amount of current) when applying the read voltage 430, because the read voltage 430 is above the threshold voltage for each of those memory cells 205 (e.g., because the distribution 410 is below the read voltage 430). In other words, memory cells 205 in the SET state will "threshold" in response to the read voltage 430 being applied. On the other hand, memory cells 205 of the representative population that store the RESET state may not permit a flow of current when applying the read voltage 430, or may permit some flow of current that is below a threshold (e.g., a leakage current) because the read voltage 430 is below the threshold voltage for each of those memory cells 205 (e.g., because the distribution 420 is above the read voltage 430). In other words, memory cells 205 in the RESET state may not threshold in response to the read voltage 430 being applied. Accordingly, a detection of whether or not a memory cell 205 thresholds in response an application of the reference voltage 430 may be used to evaluate whether the memory cell 205 was written with a SET state or a RESET state.

The plot 400 may also be illustrative of various margins that may be applicable to access operations of the representative population of memory cells 205. For example, an "E3 margin" may refer to a difference between the edge 421 of the distribution 420 (e.g., a lower edge of a distribution associated with a logic state or material state having a relatively high threshold voltage) and the reference voltage 430. Generally, an E3 margin may refer to the margin against inadvertently detecting a relatively low resistance of memory cells 205 in the RESET state or inadvertently thresholding memory cells 205 in the RESET state with a given reference voltage 430 (e.g., inadvertently detecting or interpreting a SET state when reading a memory cell 205 that should store the RESET state or was written with the RESET state). Accordingly, improving an E3 margin may be associated with widening a margin between the distribution 420 and a reference voltage 430 (e.g., by shifting the reference voltage 430 to a lower voltage, by shifting the edge 421 to a higher voltage, by shifting the distribution 420 to higher voltages).

In another example, an "E2 margin" may refer to a difference between the edge 412 of the distribution 410 (e.g., an upper edge of a distribution associated with a logic state or material state having a relatively low threshold voltage) and the reference voltage 430. Generally, an E2 margin may refer to the margin against inadvertently detecting a relatively high resistance of memory cells 205 in the SET state or failing to threshold memory cells 205 in the SET state with a given read voltage 430 (e.g., inadvertently detecting or interpreting a RESET state when reading a memory cell 205 that should store the SET state or was written with the SET state). Accordingly, improving an E2 margin may be associated with widening a margin between the distribution 410 and a reference voltage 430 (e.g., by shifting the read voltage 430 to a higher voltage, by shifting the edge 412 to a lower voltage, by shifting the distribution 410 to lower voltages).

In some memory devices 110, distributions of characteristic voltages of a representative population of memory cells 205 (e.g., a distribution 410, a distribution 420, or both) may change or migrate over the course of operating the memory device 110. For example, the plot 400 illustrates an example where the characteristic voltages for the RESET state migrate from the distribution 420 to the distribution 420-a. In some examples, such a migration may be caused by write operations on target memory cells 205 (e.g., a rate of write operations, a quantity of write operations within a time period) driving heat transfer into non-target memory cells 205. For example, as described herein, such heat transfer or associated rise in regional temperature may cause changes in atomic configuration, resistance, threshold voltage, or other characteristic that, directionally, causes memory cells 205 written in the RESET state to behave more like memory cells 205 written in the SET state. In other words, as a result of write operations performed on target memory cells 205, the characteristic voltages of the representative population of memory cells 205 for the RESET states may shift downward. In some examples, the decrease in characteristic voltage of the corresponding edge 421 to edge 421-a may be described as an E3 migration.

Although the shift from distribution 420 to distribution 420-a may illustrate a relatively uniform migration of characteristic voltages for a population of memory cells 205 (e.g., a mean shift without an accompanying change in standard deviation), the disturbances described herein may cause other types of migrations. In one example, certain memory cells 205, such as those that are relatively close to the lower edge of the distribution (e.g., memory cells 205 nearer an edge 421 or E3) may be more susceptible to logic state degradation. For example, memory cells 205 near the lower edge of the distribution may be more susceptible to nucleation of crystalline regions in the presence of a thermal disturbance, such that the lower edge of the distribution 420 may migrate farther along the voltage axis than the upper edge of the distribution 420 (e.g., where an E3 migration is greater than an E4 migration). In various examples, such a migration may cause a slope of the distribution 420 in the plot 400 to change (e.g., changing a standard deviation of the distribution 420), or be distorted into a non-linear shape in the plot 400 (e.g., distorting into a non-uniform distribution 420). In some examples, migrations may be relatively uniform in some regions of a memory array, and may be more distorted in other regions of the memory array.

The migration of characteristic voltages of the representative population of memory cells 205 in the RESET state may be accompanied by a reduction in voltage margins for the associated memory device 110. For example, as edge 421 decreases in voltage (e.g., due to E3 migration) to edge 421-a, the lower edge of the distribution 420 may become closer to, or fall below the reference voltage 430, illustrating a decrease, collapse, or elimination of an E3 margin.

In accordance with examples as disclosed herein, logic state degradation, such as degradation illustrated by the migration from distribution 420 to distribution 420-a, may be reduced or eliminated by supporting operational modes where a memory device refrains from, or is inhibited from, writing information to the representative set of the memory cells 205 (e.g., a region of a memory array). In some examples, such a pause or inhibition of write operations may support a set of memory cells 205 returning to a nominal state or condition where the memory cells 205 are less susceptible to the migration from distribution 420 to distribution 420-a. In other words, the described techniques for inhibiting or pausing write operations may prevent or mitigate such a migration, which may enable the corresponding memory device to maintain read margins (e.g., maintaining an E3 margin) without requiring periodic refresh operations, or supporting a reduction in frequency or other change in configuration of such refresh operations.

Returning to the illustrative example of system 100 described with reference to FIG. 1, a host device 105, a memory device 110, or both, may be configured to support the described techniques to reduce logic state degradation in a memory array 170. For example, in various implementations or designs, a memory device 110 (e.g., a device memory controller 155, a local memory controller 165) may be configured to carry out certain techniques without communication with the host device 105, or a memory device 110 may be configured to carry out certain techniques based at least in part on communication or signaling from the host device 105 (e.g., based on operations performed at an external memory controller 120), or the host device 105 and the memory device 110 may be jointly configured to carry out certain techniques in a coordinated or supportive manner.

In various examples, techniques for identifying conditions that may warrant refraining from, inhibiting, or otherwise pausing write operations or other access operations may be performed by one or both of the host device 105 or the memory device 110. For example, the memory device 110 may be configured to identify that a quantity of write operations performed on a region of a memory array 170 satisfies (e.g., exceeds, meets, is greater than or equal to) a threshold, that a quantity of write operations performed on a region of a memory array 170 during a duration satisfies a threshold, or that a rate of write operations performed on a region of a memory array 170 satisfies a threshold. In some examples, the memory device 110 may signal, to the host device 105, that such conditions have been identified by the memory device 110, which may or may not include indicating a particular memory array 170 or region of a memory array 170.

Additionally or alternatively, the host device 105 may be configured to identify that a quantity of write operations commanded to or otherwise performed on a region of a memory array 170 satisfies (e.g., exceeds, meets, is greater than or equal to) a threshold, that a quantity of write operations commanded to or otherwise performed on a region of a memory array 170 during a duration satisfies a threshold, or that a rate of write operations commanded to or otherwise performed on a region of a memory array 170 satisfies a threshold. In some examples, the host device 105 may signal, to the memory device 110, that such conditions have been identified by the host device 105, which may or may not include indicating a particular memory array 170 or region of a memory array 170.

Although discussed in the context of write operations, some techniques may make such an identification (e.g., at a host device 105, at a memory device 110) based on other types of access operations, or more generally on a total quantity of access operations or rate of access operations. In some examples, access operations of a particular type (e.g., write operations, read operations, refresh operations) may or may not be weighted differently as part of the identifying, which may be based on a propensity for such types of access operations causing a disturbance to neighboring memory cells. In some examples, an identification may include, either directly or indirectly, identifying that a rate of heating or heat transfer in the region of the memory array 170 satisfies a threshold, which may or may not consider a bulk or ambient temperature measured at a host device 105 or a memory device 110 (e.g., to estimate local heat transfer or temperature rise in a region of a memory array 170).

Moreover, techniques inhibiting, refraining from, or otherwise pausing write operations may be performed by one or both of the host device 105 or the memory device 110. For example, the memory device 110 may be configured to refrain from writing information to a region of a memory array 170 based on the various techniques for identifying conditions that may warrant refraining from, inhibiting, or otherwise pausing write operations. For example, the memory device 110 may be configured for such refraining based on an identification made by the memory device 110 itself, or based on an identification made by the host device 105 and signaled to the memory device 110. In some examples, such refraining may be performed for a duration, which may be a preconfigured duration, a duration that is determined (e.g., at the host device 105 or the memory device 110) based on conditions identified by the memory device 110 or the host device 105, or some combination thereof (e.g., a selection, based on identified conditions, from a set of preconfigured durations).

During such refraining, the memory device 110 may handle incoming access commands from the host device 105 according to various techniques. In one example, the memory device 110 may store write commands in a buffer (e.g., of the memory device 110) and perform write operations corresponding to the commands stored in the buffer after completing a period of refraining. In another example, based on refraining from performing write operations on a region of a memory array 170, the memory device 110 may determine to perform received write commands on a different region of the same memory array 170, or on a different memory array 170 altogether. In other examples, the memory device 110 may ignore such access commands (e.g., write commands, refresh commands) received from the host device 105, or may specifically signal that the memory device 110 has not, or is unable to, perform the received access commands, which may enable the host device 105 to hold such commands for later issuance to the memory device 110, of may enable the host device to reconfigure such commands (e.g., issuing them to a different region of a memory array 170, a different memory array 170, or a different memory device 110).

In some examples, while refraining from performing write operations, the memory device 110 may permit other access operations, such as read operations, on the region of the memory array 170. For example, other access operations, such as read operations, may be associated with a lower degree of heating or other disturbance than write operations, and accordingly may be less likely to make neighboring memory cells susceptible to logic state degradation. In other examples, while refraining from performing write operations, the memory device 110 may refrain from performing read operations, read operations and refresh operations, or access operations altogether on the memory array 170 or the region of the memory array 170. In some examples, during such refraining, the memory device 110 may signal, to the host device 105, that the memory device 110 is refraining from performing one or more of write operations, read operations, or refresh operations, or that the memory device 110 is otherwise unavailable for access operations (e.g., write operations, for a duration).

Additionally or alternatively, the host device 105 may be configured to inhibit writing information to a memory array 170 or a region of a memory array 170 based on the various techniques for identifying conditions that may warrant refraining from, inhibiting, or otherwise pausing write operations. For example, the host device 105 may be configured for such inhibiting based on an identification made by the host device 105 itself, or based on an identification made by the memory device 110 and signaled to the host device 105. In some examples, such inhibiting may be performed for a duration, which may be a preconfigured duration, a duration that is determined (e.g., at the host device 105 or the memory device 110) based on conditions identified by the host device 105 or the memory device 110, or some combination thereof (e.g., a selection, based on identified conditions, from a set of preconfigured durations).

During such inhibiting, the host device 105 may handle processing or issuing write commands according to various techniques. In one example, the host device 105 may store write commands in a buffer (e.g., of the host device 105) and transmit write operations corresponding to the commands stored in the buffer after completing a period of write operation inhibiting. In another example, based on refraining from performing write operations on a region of a memory array 170, the host device 105 may determine to perform write operations on a different region of the memory array 170 based at least in part on such inhibiting (e.g., during a duration of such inhibiting). In another example, based on refraining from performing write operations on a region of a memory array 170, the host device 105 may determine to perform write operations on a different memory array 170 based at least in part on such inhibiting (e.g., during a duration of such inhibiting). In another example, based on refraining from performing write operations on a region of a memory array 170, the host device 105 may determine to perform write operations on a different memory device 110.

In some examples, while inhibiting write operations, the host device 105 may continue to issue or transmit other types of access commands, such as read commands, for the region of the memory array 170. For example, other access commands, such as read commands, may be associated with a lower degree of heating or other disturbance than write operations, and accordingly may be less likely to make neighboring memory cells susceptible to logic state degradation. In other examples, while inhibiting write operations, the host device 105 may also inhibit read operations, read operations and refresh operations, or access operations altogether on the memory array 170 or the region of the memory array 170. In some examples, during such inhibiting, the host device 105 may signal, to the memory device 110, that the memory device 110 is to refrain from performing one or more of write operations, read operations, or refresh operations, which may be a refraining from performing access operations commanded by the same or a different host device 105.

By using various techniques in accordance with examples disclosed herein, a memory device 110, a host device 105, or a system that includes a host device 105 and a memory device 110 may be configured for reducing aspects of logic state degradation by supporting operational modes where a host device 105, a memory device 110, or both, refrains from or inhibits performing access operations on a region of a memory array. Such techniques may enable a memory device 110 to maintain suitable read margins while also reducing a rate of refresh operations, which may provide favorable performance such as reducing access errors, reducing power consumption, reducing memory cell fatigue, and other benefits.

Figure 5:
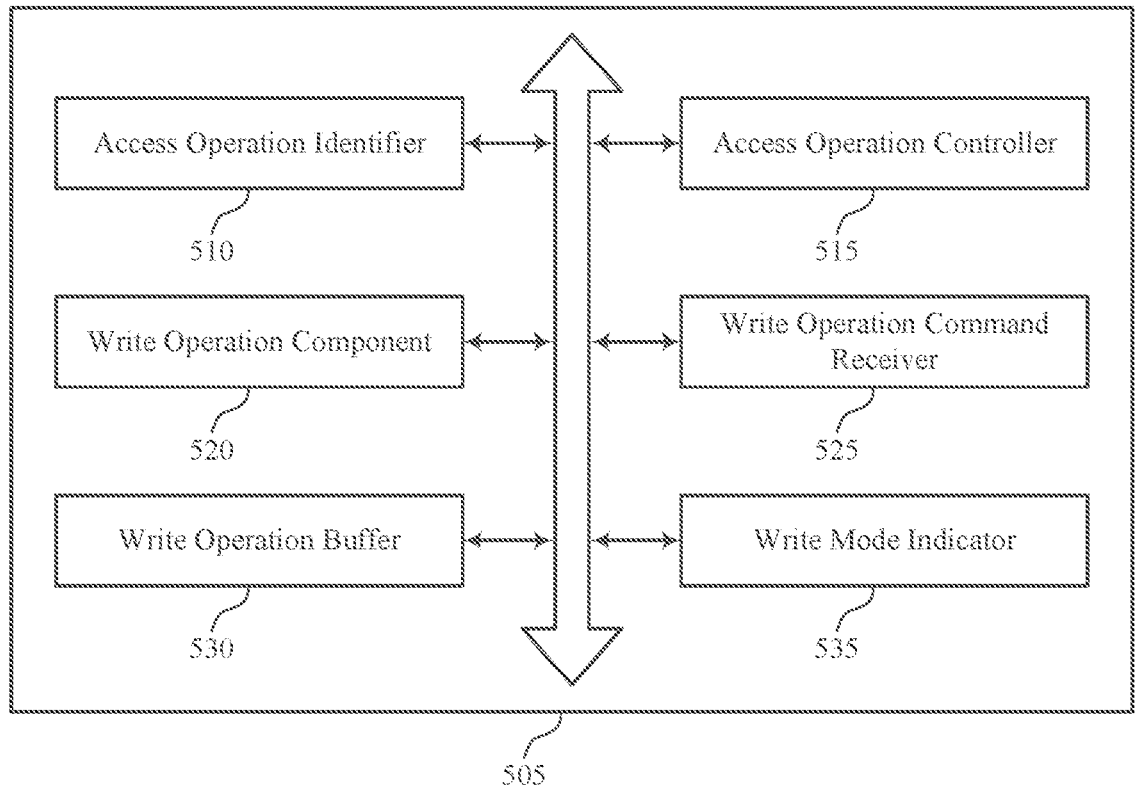
FIG. 5 shows a block diagram of a memory device that supports write operation techniques for memory systems in accordance with examples as disclosed herein.

FIG. 5 shows a block diagram 500 of a memory device 505 that supports write operation techniques for memory systems in accordance with examples as disclosed herein. The memory device 505 may be an example of aspects of a memory device as described with reference to FIGS. 1 through 7. The memory device 505 may include an access operation identifier 510, an access operation controller 515, a write operation component 520, a write operation command receiver 525, a write operation buffer 530, and a write mode indicator 535. Each of these modules may communicate, directly or indirectly, with one another (e.g., via one or more buses).

The access operation identifier 510 may identify that a quantity of write operations performed on a region of a memory array satisfies a threshold. In some examples, the access operation identifier 510 may identify that the quantity of write operations performed during a second duration satisfies the threshold. In some examples, the access operation identifier 510 may identify that a rate at which the quantity of write operations were performed satisfies a threshold. In some examples, the access operation identifier 510 may identify that a rate of heating associated with the quantity of write operations satisfies a threshold.

The access operation controller 515 may refrain from writing information to the region of the memory array for a first duration based on the quantity of write operations satisfying the threshold. In some examples, the access operation controller 515 may determine the first duration based on a second duration over which the quantity of write operations were performed or a rate at which the quantity of write operations were performed.

In some examples, the access operation controller 515 may permit read operations on the region of the memory array during at least a portion of the first duration for refraining from writing information to the region of the memory array. In some examples, the access operation controller 515 may refrain from performing read operations on the region of the memory array while refraining from performing write operations (e.g., during at least a portion of the first duration for refraining from writing information to the region of the memory array).

The write operation component 520 may perform one or more write operations on the region of the memory array based on refraining from writing information to the region for the first duration. In some examples, performing the one or more write operations on the region of the memory array includes retrieving one or more write commands from the buffer and performing the one or more write operations after the first duration. In some examples, the write operation component 520 may determine to perform write operations corresponding to the one or more write commands on a second region of the memory array based on refraining from writing information to the region for the first duration. In some examples, the write operation component 520 may direct write operations to a second region of the memory array for the first duration.

The write operation command receiver 525 may receive one or more write commands corresponding to the one or more write operations from a host device. In some examples, the write operation command receiver 525 may receive one or more write commands from a host device during the first duration.

The write operation buffer 530 may store one or more write commands in a buffer based on refraining from writing information to the region of the memory array for the first duration.

The write mode indicator 535 may signal, based on identifying that the quantity of write operations satisfies the threshold, an indication of a write mode for the first duration to a host device. In some examples, the write mode indicator 535 may indicate, to the host device, that the memory device is refraining from performing write operations. In some examples, the write mode indicator 535 may indicate, to the host device, the region of the memory array.

Figure 6:
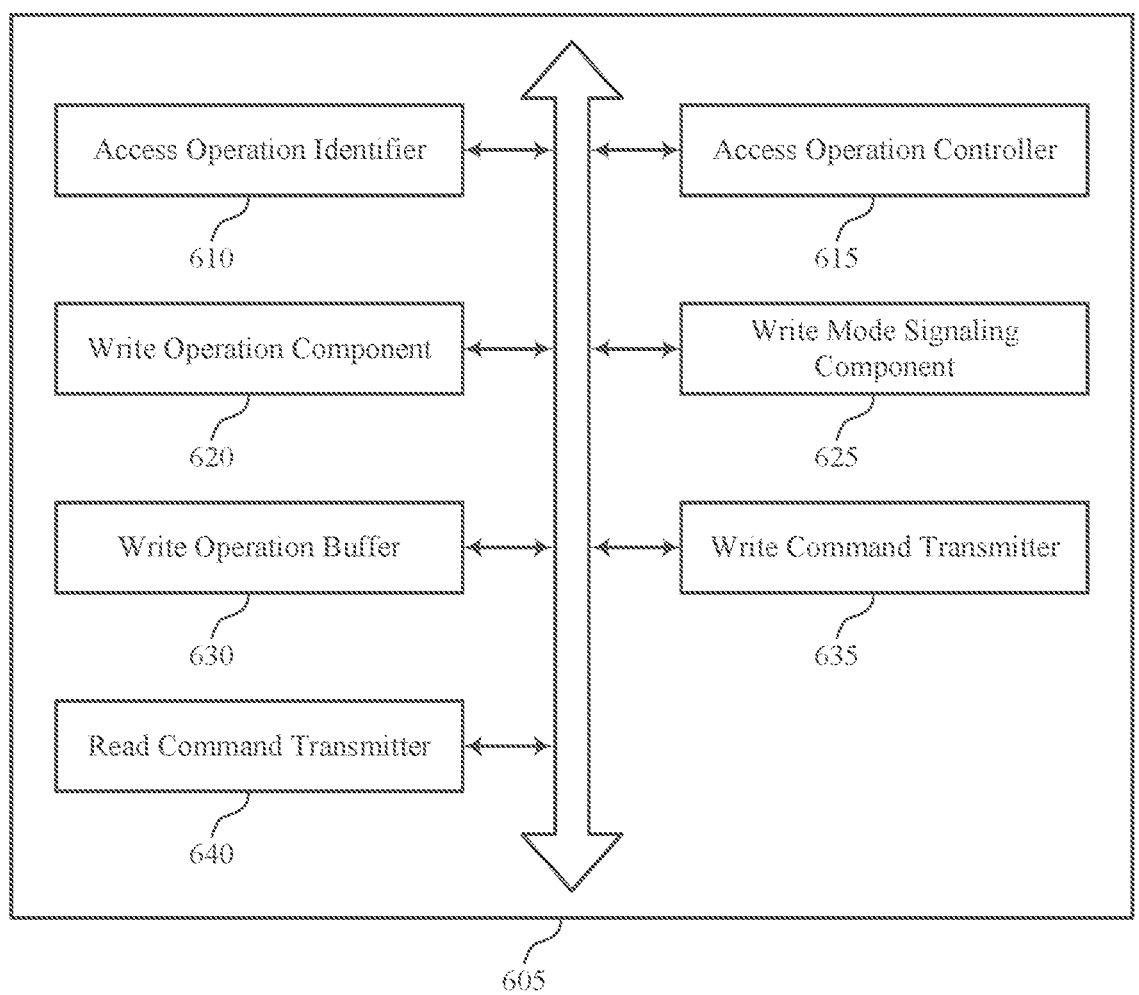
FIG. 6 shows a block diagram of a host device that supports write operation techniques for memory systems in accordance with examples as disclosed herein.

FIG. 6 shows a block diagram 600 of a host device 605 that supports write operation techniques for memory systems in accordance with examples as disclosed herein. The host device 605 may be an example of aspects of a host device as described with reference to FIGS. 1 through 7. The host device 605 may include an access operation identifier 610, an access operation controller 615, a write operation component 620, a write mode signaling component 625, a write operation buffer 630, a write command transmitter 635, and a read command transmitter 640. Each of these modules may communicate, directly or indirectly, with one another (e.g., via one or more buses).

The access operation identifier 610 may identify that a quantity of write operations performed on a region of a memory array of a memory device satisfies a threshold. In some examples, the access operation identifier 610 may identify that the quantity of write operations performed during a second duration satisfies the threshold. In some examples, the access operation identifier 610 may identify that a rate at which the quantity of write operations were performed satisfies a threshold. In some examples, the access operation identifier 610 may identify that a rate of heating associated with the quantity of write operations satisfies a threshold.

The access operation controller 615 may inhibit writing information to the region of the memory array for a first duration based on the quantity of write operations satisfying the threshold. In some examples, the access operation controller 615 may determine to perform one or more write operations on a second region of the memory array based on inhibiting writing information during the first duration. In some examples, the access operation controller 615 may determine to perform one or more write operations on a second memory device based on inhibiting writing information during the first duration. In some examples, the access operation controller 615 may determine the first duration based on a second duration over which the quantity of write operations were performed or a rate at which the quantity of write operations were performed. In some examples, the access operation controller 615 may inhibit read operations on the region of the memory array while inhibiting write operations.

The write operation component 620 may perform one or more write operations based on inhibiting writing information to the region of the memory array for the first duration.

The write mode signaling component 625 may transmit, to the memory device, an indication that the memory device is to refrain from writing information to the region of the memory array for the first duration. In some examples, the write mode signaling component 625 may signal, based on identifying that the quantity of write operations satisfies the threshold, an indication of a write mode for the first duration to the memory device. In some examples, the write mode signaling component 625 may indicate, to the memory device, that the host device is inhibiting write operations. In some examples, the write mode signaling component 625 may indicate, to the memory device, the region of the memory array.

The write operation buffer 630 may store one or more write commands in a write buffer.

The write command transmitter 635 may transmit the one or more write commands to the memory device following the first duration. In some examples, the write command transmitter 635 may transmit one or more write commands for a second region of the memory array based on determining to perform the one or more write operations on the second region of the memory array. In some examples, the write command transmitter 635 may transmit one or more write commands to a second memory device based on determining to perform the one or more write operations on the second memory device.

The read command transmitter 640 may transmit one or more read commands for one or more read operations to be performed on the region of the memory array during at least a portion of the first duration for inhibiting writing information in the region of the memory array.

Figure 7:
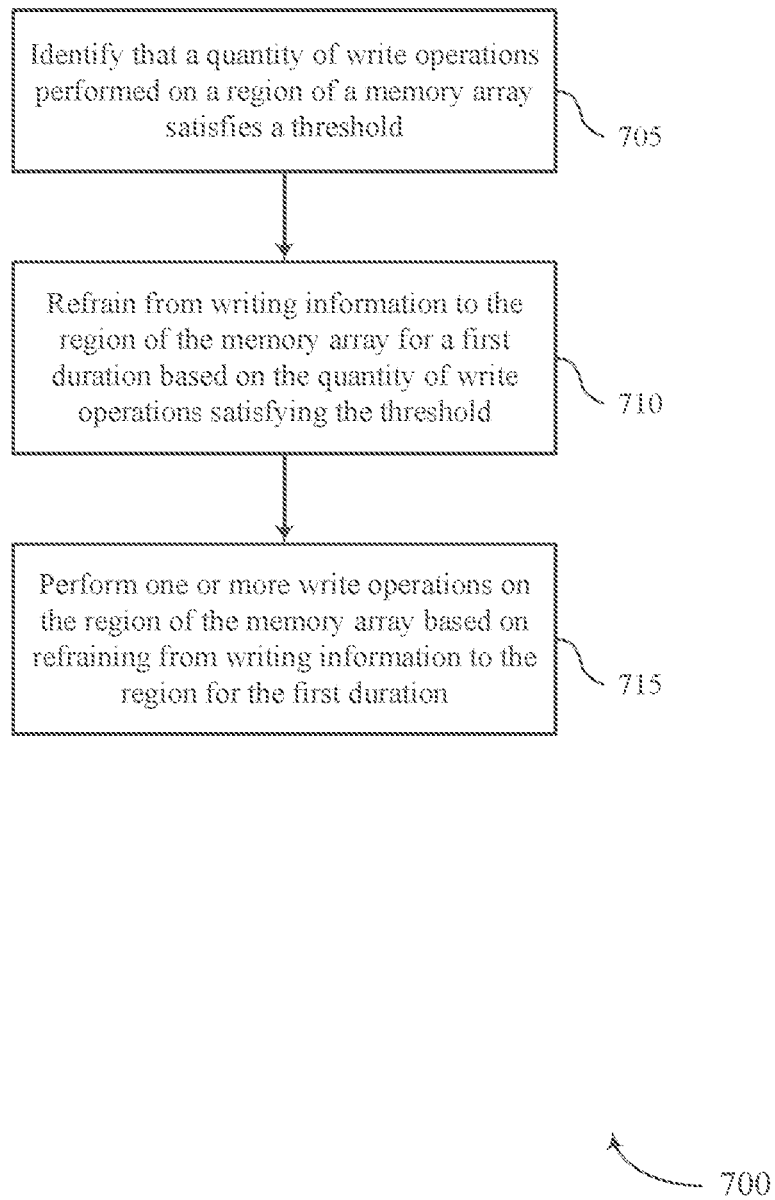
FIGS. 7 and 8 show flowcharts illustrating a method or methods that support write operation techniques for memory systems in accordance with examples as disclosed herein.

FIG. 7 shows a flowchart illustrating a method or methods 700 that supports write operation techniques for memory systems in accordance with examples as disclosed herein. The operations of method 700 may be implemented by a memory device or its components as described herein. For example, the operations of method 700 may be performed by a memory device as described with reference to FIG. 5. In some examples, a memory device may execute a set of instructions to control the functional elements of the memory device to perform the described functions. Additionally or alternatively, a memory device may perform aspects of the described functions using special-purpose hardware.

At 705, the memory device may identify that a quantity of write operations performed on a region of a memory array satisfies a threshold. The operations of 705 may be performed according to the methods described herein. In some examples, aspects of the operations of 705 may be performed by an access operation identifier as described with reference to FIG. 5.

At 710, the memory device may refrain from writing information to the region of the memory array for a first duration based on the quantity of write operations satisfying the threshold. The operations of 710 may be performed according to the methods described herein. In some examples, aspects of the operations of 710 may be performed by an access operation controller as described with reference to FIG. 5.

At 715, the memory device may perform one or more write operations on the region of the memory array based on refraining from writing information to the region for the first duration. The operations of 715 may be performed according to the methods described herein. In some examples, aspects of the operations of 715 may be performed by a write operation component as described with reference to FIG. 5.

In some examples, an apparatus as described herein may perform a method or methods, such as the method 700. The apparatus may include features, circuitry, means, or instructions (e.g., a non-transitory computer-readable medium storing instructions executable by a processor) for identifying, at a memory device, that a quantity of write operations performed on a region of a memory array satisfies a threshold, refraining from writing information to the region of the memory array for a first duration based on the quantity of write operations satisfying the threshold, and performing one or more write operations on the region of the memory array based on refraining from writing information to the region for the first duration.

Some examples of the method 700 and the apparatus described herein may further include operations, features, circuitry, means, or instructions for receiving one or more write commands corresponding to the one or more write operations from a host device, and storing the one or more write commands in a buffer based on refraining from writing information to the region of the memory array for the first duration. In some examples, performing the one or more write operations on the region of the memory array includes retrieving the one or more write commands from the buffer and performing the one or more write operations after the first duration. Some examples of the method 700 and the apparatus described herein may further include operations, features, circuitry, means, or instructions for receiving one or more write commands from a host device during the first duration, and determining to perform write operations corresponding to the one or more write commands on a second region of the memory array based on refraining from writing information to the region for the first duration.

In some examples of the method 700 and the apparatus described herein, identifying that the quantity of write operations satisfies the threshold may include operations, features, circuitry, means, or instructions for identifying that the quantity of write operations performed during a second duration satisfies the threshold. Some examples of the method 700 and the apparatus described herein may further include operations, features, circuitry, means, or instructions for determining the first duration based on a second duration over which the quantity of write operations were performed or a rate at which the quantity of write operations were performed.

Some examples of the method 700 and the apparatus described herein may further include operations, features, circuitry, means, or instructions for permitting read operations on the region of the memory array during at least a portion of the first duration for refraining from writing information to the region of the memory array. Some examples of the method 700 and the apparatus described herein may further include operations, features, circuitry, means, or instructions for signaling, based on identifying that the quantity of write operations satisfies the threshold, an indication of a write mode for the first duration to a host device.

In some examples of the method 700 and the apparatus described herein, the signaling may include operations, features, circuitry, means, or instructions for indicating, to the host device, that the memory device is refraining from performing write operations. In some examples of the method 700 and the apparatus described herein, the signaling may include operations, features, circuitry, means, or instructions for indicating, to the host device, the region of the memory array. In some examples of the method 700 and the apparatus described herein, the refraining may include operations, features, circuitry, means, or instructions for directing write operations to a second region of the memory array for the first duration. In some examples of the method 700 and the apparatus described herein, the identifying may include operations, features, circuitry, means, or instructions for identifying that a rate at which the quantity of write operations were performed satisfies a threshold.

In some examples of the method 700 and the apparatus described herein, the identifying may include operations, features, circuitry, means, or instructions for identifying that a rate of heating associated with the quantity of write operations satisfies a threshold. Some examples of the method 700 and the apparatus described herein may further include operations, features, circuitry, means, or instructions for refraining from performing read operations on the region of the memory array while refraining from performing write operations.

Figure 8:
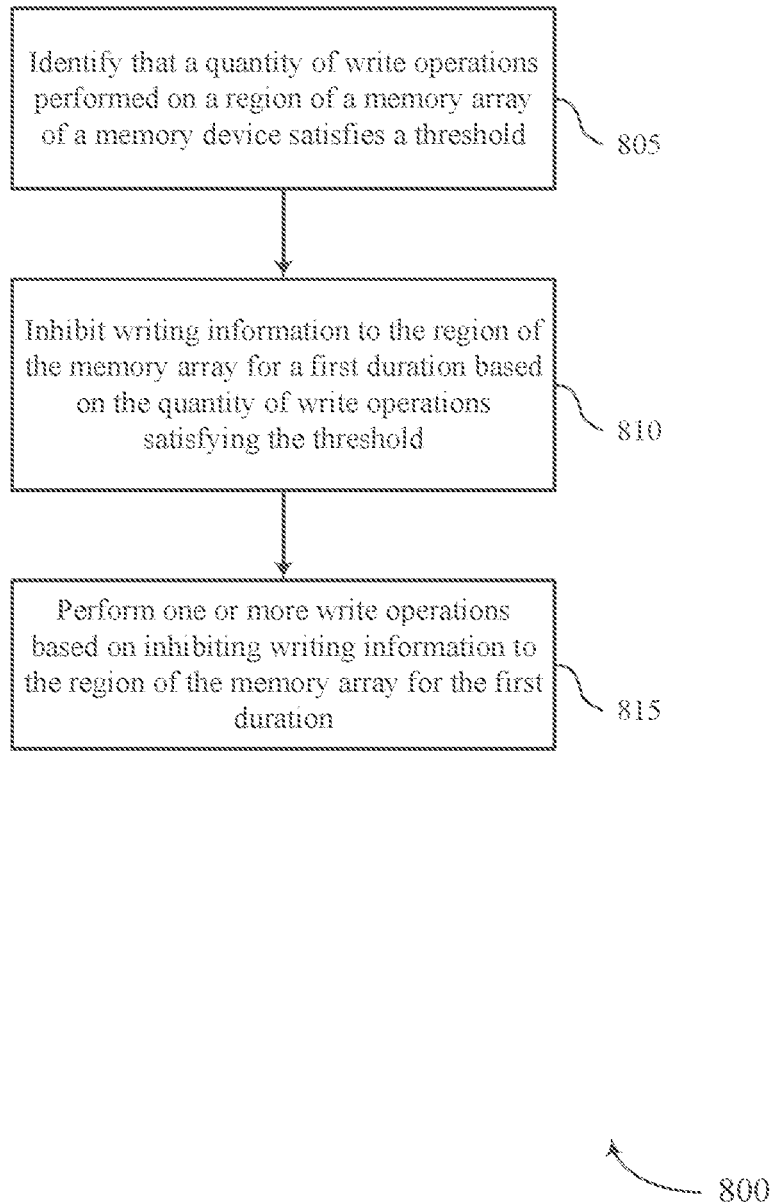

FIG. 8 shows a flowchart illustrating a method or methods 800 that supports write operation techniques for memory systems in accordance with examples as disclosed herein. The operations of method 800 may be implemented by a host device or its components as described herein. For example, the operations of method 800 may be performed by a host device as described with reference to FIG. 6. In some examples, a host device may execute a set of instructions to control the functional elements of the host device to perform the described functions. Additionally or alternatively, a host device may perform aspects of the described functions using special-purpose hardware.

At 805, the host device may identify that a quantity of write operations performed on a region of a memory array of a memory device satisfies a threshold. The operations of 805 may be performed according to the methods described herein. In some examples, aspects of the operations of 805 may be performed by an access operation identifier as described with reference to FIG. 6.

At 810, the host device may inhibit writing information to the region of the memory array for a first duration based on the quantity of write operations satisfying the threshold. The operations of 810 may be performed according to the methods described herein. In some examples, aspects of the operations of 810 may be performed by an access operation controller as described with reference to FIG. 6.

At 815, the host device may perform one or more write operations based on inhibiting writing information to the region of the memory array for the first duration. The operations of 815 may be performed according to the methods described herein. In some examples, aspects of the operations of 815 may be performed by a write operation component as described with reference to FIG. 6.

In some examples, an apparatus as described herein may perform a method or methods, such as the method 800. The apparatus may include features, circuitry, means, or instructions (e.g., a non-transitory computer-readable medium storing instructions executable by a processor) for identifying, at a host device, that a quantity of write operations performed on a region of a memory array of a memory device satisfies a threshold, inhibiting, at the host device, writing information to the region of the memory array for a first duration based on the quantity of write operations satisfying the threshold, and performing one or more write operations based on inhibiting writing information to the region of the memory array for the first duration.

Some examples of the method 800 and the apparatus described herein may further include operations, features, circuitry, means, or instructions for transmitting, to the memory device, an indication that the memory device is to refrain from writing information to the region of the memory array for the first duration.

In some examples of the method 800 and the apparatus described herein, performing the one or more write operations may include operations, features, circuitry, means, or instructions for storing one or more write commands in a write buffer, and transmitting the one or more write commands to the memory device following the first duration. Some examples of the method 800 and the apparatus described herein may further include operations, features, circuitry, means, or instructions for determining to perform one or more write operations on a second region of the memory array based on inhibiting writing information during the first duration, and transmitting one or more write commands for the second region of the memory array based on determining to perform the one or more write operations on the second region of the memory array.

Some examples of the method 800 and the apparatus described herein may further include operations, features, circuitry, means, or instructions for determining to perform one or more write operations on a second memory device based on inhibiting writing information during the first duration, and transmitting one or more write commands to the second memory device based on determining to perform the one or more write operations on the second memory device. In some examples of the method 800 and the apparatus described herein, identifying that the quantity of write operations performed on the region of the memory array satisfies the threshold may include operations, features, circuitry, means, or instructions for identifying that the quantity of write operations performed during a second duration satisfies the threshold.

Some examples of the method 800 and the apparatus described herein may further include operations, features, circuitry, means, or instructions for determining the first duration based on a second duration over which the quantity of write operations were performed or a rate at which the quantity of write operations were performed. Some examples of the method 800 and the apparatus described herein may further include operations, features, circuitry, means, or instructions for transmitting one or more read commands for one or more read operations to be performed on the region of the memory array during at least a portion of the first duration for inhibiting writing information in the region of the memory array.

In some examples of the method 800 and the apparatus described herein, the identifying may include operations, features, circuitry, means, or instructions for identifying that a rate at which the quantity of write operations were performed satisfies a threshold. In some examples of the method 800 and the apparatus described herein, the identifying may include operations, features, circuitry, means, or instructions for identifying that a rate of heating associated with the quantity of write operations satisfies a threshold. Some examples of the method 800 and the apparatus described herein may further include operations, features, circuitry, means, or instructions for inhibiting read operations on the region of the memory array while inhibiting write operations.

Some examples of the method 800 and the apparatus described herein may further include operations, features, circuitry, means, or instructions for signaling, based on identifying that the quantity of write operations satisfies the threshold, an indication of a write mode for the first duration to the memory device. In some examples of the method 800 and the apparatus described herein, the signaling may include operations, features, circuitry, means, or instructions for indicating, to the memory device, that the host device is inhibiting write operations. In some examples of the method 800 and the apparatus described herein, the signaling may include operations, features, circuitry, means, or instructions for indicating, to the memory device, the region of the memory array.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a memory array including a set of memory cells and a controller. The controller may be operable to identify that a quantity of write operations performed on a region of the memory array satisfies a threshold, refrain from writing information to the region of the memory array for a first duration based on the quantity of write operations satisfying the threshold, and perform one or more write operations on the region of the memory array based on refraining from writing information to the region of the memory array for the first duration.

In some examples, the controller may be operable to receive one or more write commands corresponding to the one or more write operations from a host device, and store the one or more write commands in a buffer based on refraining from writing information to the region of the memory array for the first duration. In some examples, to perform the one or more write operations on the region of the memory array, the controller may be operable to retrieve the one or more write commands from the buffer and perform the one or more write operations after the first duration. In some examples, the controller may be operable to receive one or more write commands from a host device during the first duration, and determine to perform write operations corresponding to the one or more write commands on a second region of the memory array based on refraining from writing information to the region of the memory array for the first duration.

In some examples, the controller may be operable to determine the first duration based on a second duration over which the quantity of write operations were performed or a rate at which the quantity of write operations were performed. In some examples, the controller may be operable to permit read operations on the region of the memory array during at least a portion of the first duration for refraining from writing information to the region.

In some examples, the controller may be operable to signal, based on identifying that the quantity of write operations satisfies the threshold, an indication of a write mode for the first duration to a host device. In some examples, each of the memory cells includes a respective chalcogenide material element. In some examples, the controller may be operable to direct write operations to a second region of the memory array for the first duration. In some examples, the controller may be operable to identify that a duration over which the quantity of write operations were performed satisfies a threshold. In some examples, the controller may be operable to identify that a rate at which the quantity of write operations were performed satisfies a threshold.

In some examples, the controller may be operable to identify that a rate of heating associated with the quantity of write operations satisfies a threshold. In some examples, the controller may be operable to determine the first duration based on a duration over which the quantity of write operations were performed or a rate at which the quantity of write operations were performed. In some examples, the controller may be operable to refrain from performing read operations on the region of the memory array while refraining from performing write operations. In some examples, each of the memory cells includes a respective material memory element. In some examples, each of the memory cells may be operable to store a logic state based on an atomic configuration of a respective material of the memory cell. In some examples, each of the memory cells may be operable to store a logic state based on a threshold voltage of a respective material of the memory cell.

An apparatus is described. The apparatus may include a host device operable to be coupled with a memory device and a controller. The controller may be operable to identify that a quantity of write operations performed on a region of a memory array of the memory device satisfies a threshold, inhibit writing information to the region of the memory array for a first duration based on the quantity of write operations satisfying the threshold, and perform one or more write operations based on inhibiting writing information to the region of the memory array for the first duration.

In some examples, the controller may be operable to transmit, to the memory device, an indication that the memory device is to refrain from writing information to the region of the memory array for the first duration. In some examples, the controller may be operable to store one or more write commands in a write buffer, and transmit the one or more write commands to the memory device following the first duration.

In some examples, the controller may be operable to determine to perform one or more write operations on a second region of the memory array based on inhibiting writing information during the first duration, and transmit one or more write commands for the second region of the memory array based on determining to perform the one or more write operations on the second region of the memory array. In some examples, the controller may be operable to determine to perform one or more write operations on a second memory device based on inhibiting writing information during the first duration, and transmit one or more write commands to the second memory device based on determining to perform the one or more write operations on the second memory device.

In some examples, the controller may be operable to identify that the quantity of write operations performed during a second duration satisfies the threshold. In some examples, the controller may be operable to determine the first duration based on a second duration over which the quantity of write operations were performed or a rate at which the quantity of write operations were performed. In some examples, the controller may be operable to inhibit read operations on the region of the memory array while inhibiting write operations. In some examples, the controller may be operable to permit read operations on the region of the memory array while inhibiting write operations.

In some examples, the controller may be operable to identify that a rate at which the quantity of write operations were performed satisfies a threshold. In some examples, the controller may be operable to identify that a rate of heating associated with the quantity of write operations satisfies a threshold. In some examples, the controller may be operable to signal, based on identifying that the quantity of write operations satisfies the threshold, an indication of a write mode for the first duration to the memory device.

In some examples, the controller may be operable to indicate, to the memory device, that the host device may be inhibiting write operations. In some examples, the controller may be operable to indicate, to the memory device, the region of the memory array. In some examples, the controller may be operable to identify that a rate at which the quantity of write operations were performed satisfies a threshold.

A system is described. The system may include a host device and a memory device comprising at least one memory array having a plurality of memory cells. The system may be operable to identify, at the memory device, that a quantity of write operations performed on a region of a memory array of the memory device satisfies a threshold, signal, from the memory device to the host device, that the region of the memory array is unavailable for write operations for a first duration based at least in part on identifying that the quantity of write operations performed on the region of the memory array satisfies a threshold, and inhibit, at the host device, performing write operations on the region of the memory array based at least in part on receiving the signaling that the region of the memory array is unavailable for write operations for the first duration.

In some examples of the system, the system may be operable to store one or more write commands in a write buffer of the host device based at least in part on inhibiting performing write operations on the region of the memory array, and transmit the one or more write commands from the host device to the memory device after the first duration. In some examples of the system, the system may be operable to determine, at the host device, to perform write operations on a second region of the memory array based at least in part on inhibiting performing write operations on the region of the memory array, and transmit, from the host device to the memory device, one or more write commands for the second region of the memory array based at least in part on determining to perform write operations on the second region of the memory array.

In some examples of the system, the system may be operable to determine, at the host device, to perform write operations on a second memory device based at least in part on inhibiting performing write operations on the region of the memory array, and transmit one or more write commands from the host device to the second memory device based at least in part on determining to perform write operations on the second memory device. In some examples of the system, the system may be operable to determine the first duration based at least in part on a second duration over which the quantity of write operations were performed or a rate at which the quantity of write operations were performed.

In some examples of the system, to identify that the quantity of write operations satisfies the threshold, the memory device may be operable to identify that a duration over which the quantity of write operations were performed satisfies a threshold. In some examples of the system, to identify that the quantity of write operations satisfies the threshold, the memory device may be operable to identify that a rate at which the quantity of write operations were performed satisfies a threshold. In some examples of the system, to identify that the quantity of write operations satisfies the threshold, the memory device may be operable to identify that a rate of heating associated with the quantity of write operations satisfies a threshold.

In some examples of the system, each of the memory cells comprises a respective material memory element. In some examples of the system, each of the memory cells comprises a respective chalcogenide material element. In some examples of the system, each of the memory cells is operable to store a logic state based at least in part on an atomic configuration of a respective material of the memory cell. In some examples of the system, each of the memory cells is operable to store a logic state based at least in part on a threshold voltage of a respective material of the memory cell.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
refraining from writing information to a plurality of memory cells of a memory array for a first duration based at least in part on a quantity of write operations performed on the plurality of memory cells;
performing at least one read operation on the plurality of memory cells of the memory array during the first duration; and
writing information to the plurality of memory cells of the memory array after the first duration.

2. The method of claim 1, further comprising:
receiving a read command from a host device during the first duration, wherein performing the at least one read operation is based at least in part on the read command.

3. The method of claim 1, wherein performing the at least one read operation comprises:
determining that the at least one read operation corresponds to a lower degree of heating of the plurality of memory cells than a write operation, wherein performing the at least one read operation during the first duration for refraining from writing information to the plurality of memory cells is based at least in part on determining that the at least one read operation corresponds to the lower degree of heating of the plurality of memory cells than the write operation.

4. The method of claim 1, further comprising:
signaling, to a host device, that the plurality of memory cells are unavailable for write operations during the first duration based at least in part on refraining from writing information to the plurality of memory cells for the first duration.

5. The method of claim 1, further comprising:
receiving, from a host device, a signal indicating that the plurality of memory cells are unavailable for write operations during the first duration, wherein refraining from writing information to the plurality of memory cells for the first duration is based at least in part on the signal.

6. The method of claim 1, further comprising:
determining that the quantity of write operations performed on the plurality of memory cells satisfies a threshold, wherein refraining from writing information to the plurality of memory cells for the first duration is based at least in part on the quantity of write operations satisfying the threshold.

7. The method of claim 6, wherein the quantity of write operations are performed on the plurality of memory cells during a second duration that is prior to the first duration.

8. The method of claim 1, further comprising:
receiving, from a host device, one or more write commands corresponding to one or more write operations for the plurality of memory cells during the first duration; and
storing, during the first duration, the one or more write commands in a buffer based at least in part on refraining from writing information to the plurality of memory cells for the first duration.

9. The method of claim 8, wherein writing the information to the plurality of memory cells after the first duration comprises:
retrieving the one or more write commands from the buffer after the first duration; and
performing the one or more write operations on the plurality of memory cells based at least in part on the one or more write commands.

10. The method of claim 1, further comprising:
receiving, from a host device, one or more write commands corresponding to one or more write operations for the plurality of memory cells during the first duration; and
performing write operations corresponding to the one or more write commands on a second plurality of memory cells of the memory array or a second memory array based at least in part on refraining from writing information to the plurality of memory cells for the first duration.

11. A method, comprising:
refraining, at a host device, from issuing write commands for at least a plurality of memory cells of a memory device for a first duration based at least in part on a quantity of write operations performed on the plurality of memory cells;
issuing, to the memory device, at least one read command for the plurality of memory cells of during the first duration; and issuing, to the memory device, one or more write commands for the plurality of memory cells of after the first duration.

12. The method of claim 11, further comprising:
determining that a read operation associated with the at least one read command corresponds to a lower degree of heating of the plurality of memory cells than a write operation, wherein issuing the at least one read command during the first duration for refraining from writing information to the plurality of memory cells is based at least in part on determining that the read operation corresponds to the lower degree of heating of the plurality of memory cells than the write operation.

13. The method of claim 11, further comprising:
receiving, from the memory device, a signal indicating that the plurality of memory cells are unavailable for write operations during the first duration, wherein refraining from issuing write commands for the first duration is based at least in part on the signal.

14. The method of claim 11, further comprising:
signaling, to the memory device, that the plurality of memory cells are unavailable for write operations during the first duration based at least in part on refraining from issuing write commands for the plurality of memory cells for the first duration.

15. The method of claim 11, further comprising:
determining that the quantity of write operations performed on the plurality of memory cells satisfies a threshold, wherein refraining from issuing write commands for the plurality of memory cells for the first duration is based at least in part on the quantity of write operations satisfying the threshold.

16. The method of claim 15, wherein the quantity of write operations are performed on the plurality of memory cells during a second duration that is prior to the first duration.

17. The method of claim 11, further comprising:
storing, during the first duration, the one or more write commands in a buffer of the host device based at least in part on refraining from issuing write commands for the plurality of memory cells for the first duration; and
retrieving the one or more write commands from the buffer after the first duration, wherein issuing the one or more write commands is based at least in part on retrieving the one or more write commands from the buffer.

18. A system, comprising:
a host device; and
a memory device comprising a memory array having a plurality of memory cells, wherein the system is operable to:
signal, from the memory device to the host device, that a region of the memory array is unavailable for write operations based at least in part on a quantity of write operations performed on the region of the memory array;
refrain, at the host device, from issuing write commands for the region of the memory array for a first duration based at least in part on receiving the signaling that the region of the memory array is unavailable for write operations; and
issue, by the host device, at least one read command for one or more memory cells in the region of the memory array during the first duration.

19. The system of claim 18, wherein the system is operable to perform, at the memory device, at least one read operation on the one or more memory cells in the region of the memory array during the first duration based at least in part on receiving the at least one read command.

20. The system of claim 18, wherein the system is operable to:
issue, by the host device after the first duration, one or more write commands for the region of the memory array; and
perform, at the memory device, one or more write operations on the region of the memory array based at least in part on the one or more write commands.

* * * * *